United States Patent
Xie et al.

(10) Patent No.: US 9,330,972 B2
(45) Date of Patent: May 3, 2016

(54) METHODS OF FORMING CONTACT STRUCTURES FOR SEMICONDUCTOR DEVICES AND THE RESULTING DEVICES

(71) Applicant: GLOBALFOUNDRIES Inc., Grand Cayman (KY)

(72) Inventors: Ruilong Xie, Niskayuna, NY (US); Vimal Kamineni, Mechanicville, NY (US); William J. Taylor, Jr., Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/457,708

(22) Filed: Aug. 12, 2014

(65) Prior Publication Data
US 2016/0049332 A1    Feb. 18, 2016

(51) Int. Cl.
*H01L 27/12* (2006.01)
*H01L 21/84* (2006.01)
*H01L 21/425* (2006.01)
*H01L 21/3205* (2006.01)
*H01L 21/768* (2006.01)
*H01L 23/535* (2006.01)

(52) U.S. Cl.
CPC .... *H01L 21/76897* (2013.01); *H01L 21/76879* (2013.01); *H01L 23/535* (2013.01)

(58) Field of Classification Search
CPC ............ H01L 29/7848; H01L 29/66628; H01L 29/66636; H01L 21/823814; H01L 21/823807; H01L 29/66545; H01L 29/165; H01L 29/41783; H01L 29/665; H01L 29/78; H01L 27/1203; H01L 29/66772; H01L 21/84; H01L 21/08
USPC ........... 257/351, E29.262, E21.703, E27.112; 438/154, 243, 270, 589
See application file for complete search history.

(56) References Cited

U.S. PATENT DOCUMENTS

2006/0131648 A1* 6/2006 Ahn et al. ................. 257/347
2012/0104498 A1* 5/2012 Majumdar et al. .......... 257/351

* cited by examiner

*Primary Examiner* — Kimberly Rizkallah
*Assistant Examiner* — Brian Turner
(74) *Attorney, Agent, or Firm* — Amerson Law Firm, PLLC

(57) ABSTRACT

One method disclosed herein includes, among other things, a method of forming a contact structure to a source/drain region of a transistor device. The transistor device includes a gate structure and a gate cap layer positioned above the gate structure. The method includes forming an extended-height epi contact structure that is conductively coupled to the source/drain region. The extended-height epi contact structure includes an upper surface that is positioned at a height level that is above a height level of an upper surface of the gate cap layer. The method further includes performing an etching process to trim at least a lateral width of a portion of the extended-height epi contact structure, and, after performing the etching process, forming a metal silicide material on at least a portion of the trimmed extended-height epi contact structure and forming a conductive contact on the metal silicide material.

20 Claims, 9 Drawing Sheets

METHODS OF FORMING CONTACT STRUCTURES FOR SEMICONDUCTOR DEVICES AND THE RESULTING DEVICES

BACKGROUND

1. Field of the Disclosure

The present disclosure generally relates to the formation of semiconductor devices, and, more specifically, to various methods of forming contact structures for semiconductor devices and the resulting devices.

2. Description of the Related Art

In modern integrated circuits, such as microprocessors, storage devices and the like, a very large number of circuit elements, especially transistors, are provided and operated on a restricted chip area. Transistors come in a variety of shapes and forms, e.g., planar transistors, FinFET transistors, nanowire devices, etc. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region. Irrespective of whether a planar or non-planar device is considered, electrical connections must be formed to the device so that it may operate as intended. That is, electrical connections must be made to the source region, the drain region and the gate electrode of the device.

By using such field effect transistors, more complex circuit components may be composed, such as inverters and the like, thereby forming complex logic circuitry, embedded memories and the like. Over the recent years, due to the reduced dimensions of the transistor devices, the operating speed of the circuit components has been increased with every new device generation, and the "packing density" (i.e., devices per area) in such products has been increased over the recent years. Such improvements in the performance of transistor devices has reached the point where the limiting factor of the finally achieved operating speed of complex integrated circuit products is no longer the individual transistor element but the electrical performance of the complex wiring system that is formed above the device level, including the actual semiconductor-based circuit elements.

Typically, the conductive structures that actually make contact with the device itself, i.e., the source region, the drain region and the gate electrode, are referred to as "contacts" within the industry. Such conductive contacts are formed in one or more layers of insulating material. The entire arrangement of the conductive contacts and the associated layer(s) of insulating material are sometimes referred to as the "contact level" of the overall electrical "wiring arrangement" that is formed to provide electrical connection to the integrated circuit device. In some cases, the contact structure may comprise contact elements or contact plugs having a generally square-like or round shape that are formed in an interlayer dielectric material, which in turn encloses and passivates the circuit elements. In other cases, the contact structure may have an elongated line-type structure (e.g., so-called trench silicide structures for contacting to source/drain regions). The contact structures may be made of a variety of materials, such as tungsten, which, in combination with appropriate barrier materials, has proven to be a viable contact metal.

Typically, due to the large number of circuit elements and the required complex layout of modern integrated circuits, the electrical connections of the individual circuit elements cannot be established within the contact level, but require one or more additional metallization layers, which generally include metal-containing lines providing the intra-level electrical connection, and also include a plurality of inter-level connections or vertical connections, which are also referred to as vias. These vertical interconnect structures include an appropriate metal and provide the electrical connection of the various stacked metallization layers. In some cases, the increased packing density mandated the use of sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits.

As device dimensions have decreased, e.g., transistors with gate lengths of 50 nm and less, the contact elements in the contact level have to be provided with critical dimensions in the same order of magnitude. When forming tungsten-based contact plug elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas, and thus the available area for the contact regions, is 100 nm and significantly less, thereby requiring extremely complex lithography and etch techniques in order to form the contact openings with well-defined lateral dimensions and with a high degree of alignment accuracy.

For this reason, contact technologies have been developed in which contact openings are formed in a self-aligned manner by removing dielectric material, such as silicon dioxide, selectively from the spaces between closely spaced gate electrode structures. That is, after completing the transistor structure, the sidewall spacer material and gate cap layer adjacent the gate electrode structures are used as etch masks for selectively removing the silicon dioxide material in order to expose the contact regions of the transistors, thereby providing self-aligned trenches that are substantially laterally delineated by the spacer structures. Consequently, a corresponding lithography process only needs to define a global contact opening above an active region, wherein the contact trenches then result from the selective etch process using the exposed portions of the sidewall spacer/gate cap layer as an etch mask. Thereafter, an appropriate contact material, such as tungsten and the like, may be filled into the contact trenches/openings.

Another problem with continued scaling of transistor devices is that the electrical resistance between the conductive contacts and the transistor element is becoming a larger portion of the overall electrical resistance. Traditionally, metal silicide layers are formed in the source/drain regions of a device and on the gate electrode of a device in order to reduce electrical contact resistance. Ideally, the contact area between the metal silicide layer and the underlying silicon or epi semiconductor material could simply be increased. In the case of FinFET devices, this could theoretically be accomplished by forming the epi material on the fins in an unmerged condition, i.e., no contact between epi material on adjacent fins, and thereafter forming an individual metal silicide layer that wraps around each of the separated epi materials. In practice, this is a very difficult task for several reasons. First, when epi semiconductor material is grown on a fin, it is very difficult to control the thickness of the epi semiconductor material. Thus, the epi material may unintentionally be merged together, thereby preventing the formation of the wrap-around metal silicide layers. One possible solution to avoid such unintended fin merger would be to form the epi material on the fin to a very small thickness to virtually assure that unintended fin merger does not occur. The drawbacks to this approach are that such a very small volume of epi material will tend to increase the overall resistance and such a thin layer of epi material may be substantially consumed by the metal silicide material and/or damaged during the contact formation process.

Fundamentally, in both FETs and FinFETs, the area available for establishing electrical contact to the devices, especially the source/drain regions, has been significantly reduced due to device scaling. This decrease in available contact area is the result of the reduced lateral distance between adjacent devices due to increased packing densities. All other things being equal, the reduction in the available contact area results in an undesirable increase in contact resistance, which results in the degradation of the performance of the device. The present disclosure is directed to various methods of forming contact regions for semiconductor devices and the resulting devices that may avoid, or at least reduce, the effects of one or more of the problems identified above.

SUMMARY

The following presents a simplified summary of the disclosure in order to provide a basic understanding of some aspects of the disclosure. This summary is not an exhaustive overview. Its sole purpose is to present some concepts in a simplified form as a prelude to the more detailed description that is discussed later.

Generally, the present disclosure is directed to various methods of forming contact structures for semiconductor devices and the resulting devices. One illustrative method disclosed herein includes, among other things, a method of forming a contact structure to a source/drain region of a transistor device. The transistor device includes a gate structure and a gate cap layer positioned above the gate structure. The method includes forming an extended-height epi contact structure that is conductively coupled to the source/drain region. The extended-height epi contact structure includes an upper surface that is positioned at a height level that is above a height level of an upper surface of the gate cap layer. The method further includes performing at least one etching process to trim at least a lateral width of a portion of the extended-height epi contact structure. The method further includes, after performing the at least one etching process, forming a metal silicide material on at least a portion of the trimmed extended-height epi contact structure. The method further includes forming a conductive contact on the metal silicide material.

Another illustrative method disclosed herein includes forming a first epi semiconductor material in a source/drain region of a semiconductor device. The first epi semiconductor material includes a first lateral width at an upper surface thereof. The method further includes forming an extended-height epi contact structure on the first epi semiconductor material. The extended-height epi contact structure includes an upper surface and first and second side surfaces, all three of which collectively define a contact length of the extended-height epi contact structure that is greater than the first lateral width. The method further includes forming a metal silicide region on the upper surface and first and second side surfaces of the extended-height epi contact structure.

An illustrative device disclosed herein includes a first epi semiconductor material in a source/drain region of the device. The first epi semiconductor material includes a first lateral width at an upper surface thereof. The device further includes an extended-height epi contact structure on the first epi semiconductor material. The extended-height epi contact structure includes an upper surface and first and second side surfaces, all three of which collectively define a contact length of the extended-height epi contact structure that is greater than the first lateral width. The device further includes a metal silicide region on the upper surface and first and second side surfaces of the extended-height epi contact structure.

BRIEF DESCRIPTION OF THE DRAWINGS

The disclosure may be understood by reference to the following description taken in conjunction with the accompanying drawings, in which like reference numerals identify like elements, and in which.

Figure 1A:
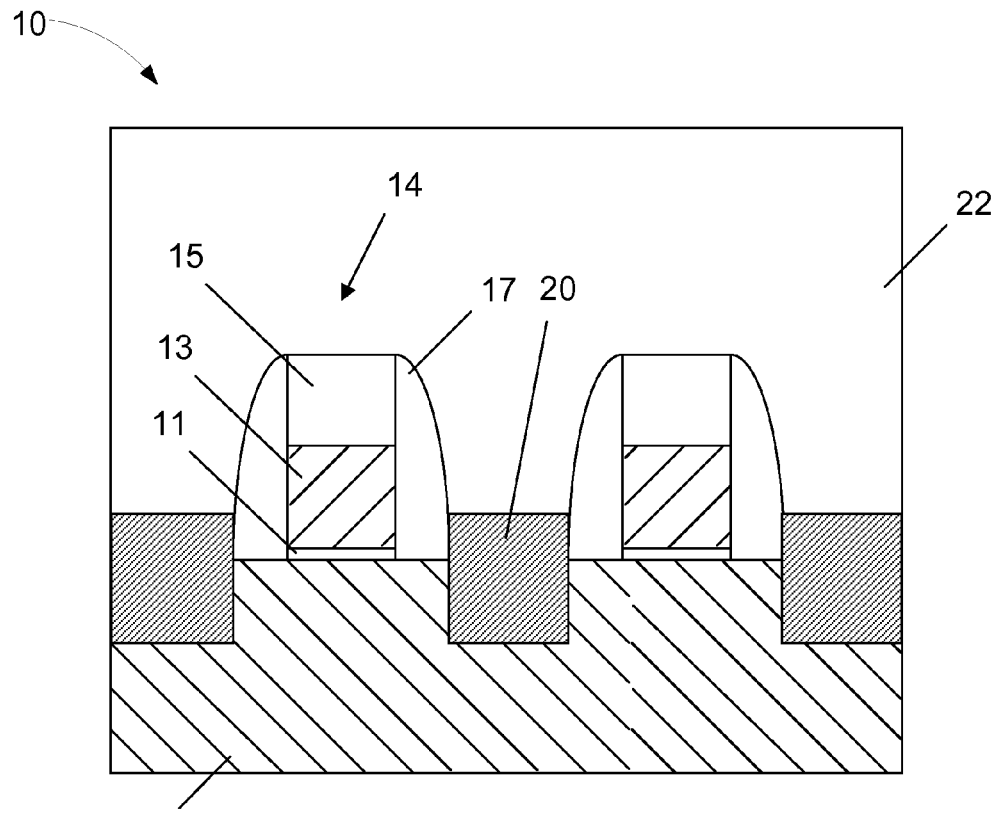
FIGS. 1A-1I depict various methods disclosed herein of forming contact structures for semiconductor devices and the resulting devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

NOTATION AND NOMENCLATURE

Certain terms are used throughout the disclosure to refer to particular components. However, different entities may refer to a component by different names. This document does not intend to distinguish between components that differ in name but not function. The terms "including" and "comprising" are used herein in open-ended fashion, and thus mean "including, but not limited to."

DETAILED DESCRIPTION

Various illustrative embodiments of the invention are described below. It will of course be appreciated that, in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming contact structures for semiconductor devices and the resulting devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. Of course, the inventions disclosed herein should not be considered limited to the illustrative examples depicted and described herein.

The methods and devices disclosed herein may be used when forming either planar or non-planar (e.g., FinFET) transistor devices. Illustrative devices 10, 100 shown in FIGS. 1A-1I and 2A-2H, respectively, in the form of planar devices will be depicted for illustrative purposes. The illustrative devices 10, 100 may be formed above an illustrative substrate 12 that may have a variety of configurations in various embodiments, such as the depicted bulk silicon configuration. The substrate 12 may also have a silicon-on-insulator ("SOI") configuration that includes a bulk silicon layer, a buried insulation layer and an active layer, wherein semiconductor devices are formed in and above the active layer. Thus, the terms "substrate" or "semiconductor substrate" should be understood to cover all semiconducting materials and all forms of such materials. The various layers of material depicted in the following drawings may be formed by any of a variety of different known techniques, e.g., a chemical vapor deposition (CVD) process, an atomic layer deposition (ALD) process, a thermal growth process, spin-coating techniques, etc.

FIGS. 1A-1I depict one illustrative method of forming contact structures for semiconductor devices and the resulting devices. At the point of fabrication depicted in FIG. 1A, the device 10 includes a substrate 12, raised source/drain regions 20, a layer of insulating material 22 and a gate structure 14. Raised source/drain regions 20 are not required to practice at least some aspects of the presently disclosed inventions. The gate structure 14 may be formed using either gate-first or replacement gate techniques. In the depicted example, the gate structure 14 includes an illustrative gate insulation layer 11 and an illustrative gate electrode 13. In at least one embodiment, the gate structure 14 is implemented in a high-k/metal gate configuration. As used herein and in the attached claims, the term "high-k" material or layer means a material having a dielectric constant greater than approximately 10. A gate cap layer 15 and sidewall spacer 17 encapsulate and protect the gate structure 14. The various components and structures of the device 10 may be formed by performing a variety of deposition processes, patterning processes, etching processes, doping processes, etc.

Also, the various components and structures of the device 10 may be formed using a variety of different materials. The layer of insulating material 22 may include silicon dioxide, and the source/drain regions 20 may include dopant materials (N-type dopants for NMOS devices and P-type dopants for PMOS devices). The gate cap layer 15 and sidewall spacer 17 may include silicon nitride. The gate electrode 13 may include aluminum or other conductive metals in various embodiments. The thicknesses of the various layers of material may also vary depending upon the particular application.

Figure 1B:
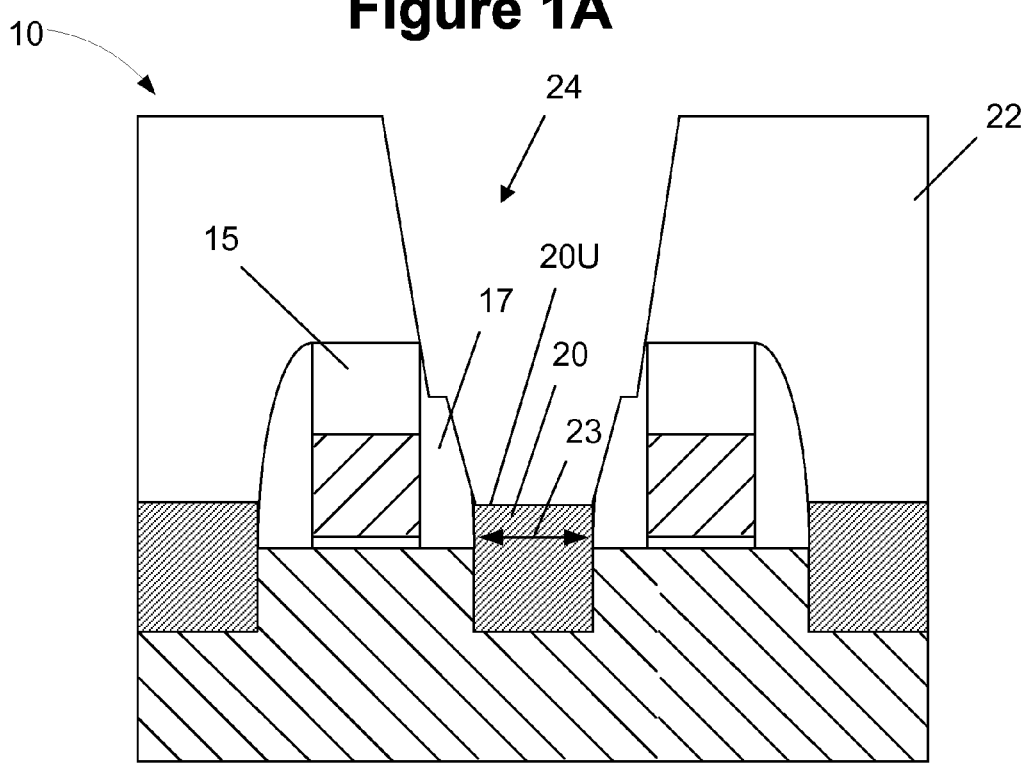

FIG. 1B illustrates the device 10 after one or more etching processes were performed using the source/drain regions 20 as an etch stop to form an opening or trench 24 in the layer of insulating material 22. As shown, a portion of the sidewall spacer material 17 may be removed due to the etching process. A portion of the gate cap layer 15 may also be removed depending upon the accuracy of the alignment of the contact opening 24. The etching process exposes the source/drain region 20 for further processing. The source/drain region 20 includes an upper surface 20U having a lateral width 23. Using prior art techniques, when the opening 24 is filled with a contact structure, the lateral width 23 of the source/drain region 20 corresponds to the contact length of the contact structure.

Figure 1C:
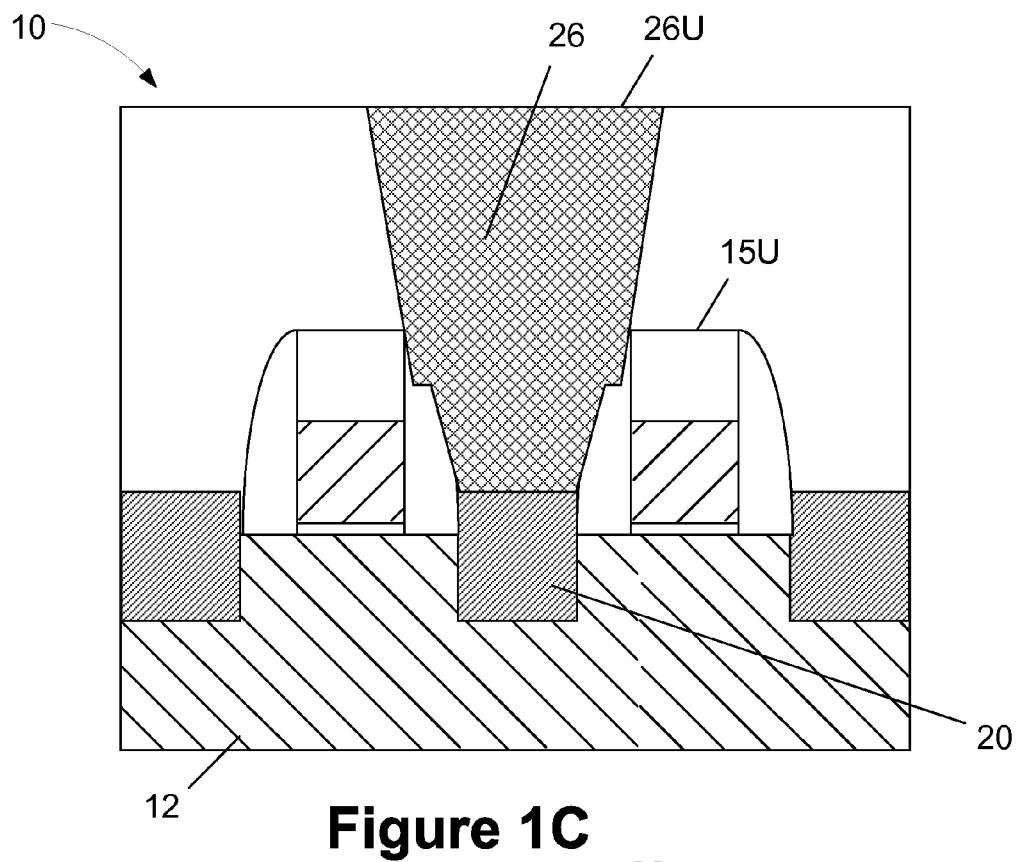

FIG. 1C illustrates the device 10 after an extended-height epi contact structure 26 was formed in the contact opening 24. The extended-height epi contact structure 26 may be formed by performing one or more epi growth processes and thereafter performing a chemical mechanical polish ("CMP") process to remove excess epi material positioned outside of the contact opening 24. In at least one embodiment, the extended-height epi contact structure 26 is made of an epi material that is substantially the same as the material of the epi material formed for the raised source/drain region 20. For example, both materials may be silicon, both materials may be silicon germanium, etc. In other embodiments, the extended-height epi contact structure 26 may be made of an epi material that is different from the epi material (if any) in the source/drain region 20 or the substrate 12. The extended-height epi contact structure 26 may be formed to any desired height above the source/drain region 20, and the extended-height epi contact structure 26 may be heavily doped to ensure low resistance. In the depicted example, the upper surface 26U of the extended-height epi contact structure 26 is at a level that is above the upper surface 15U of the gate cap layer 15. In one example, the difference in height levels between the surfaces may be about 30-100 nm, but the height difference may vary depending upon the application.

Figure 1D:
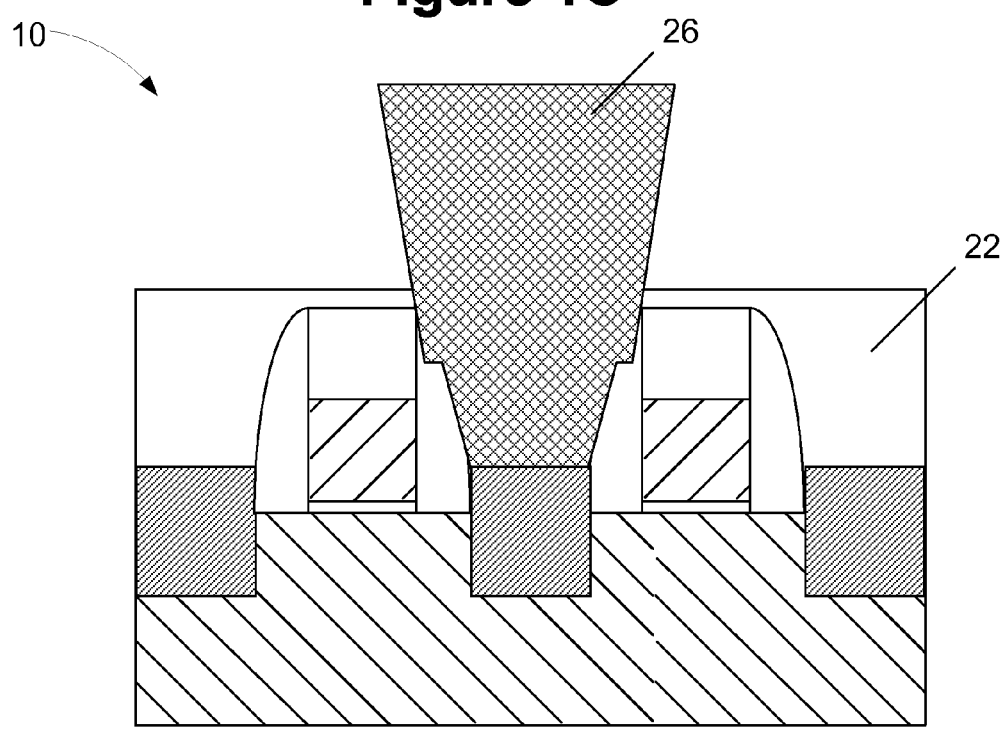

FIG. 1D illustrates the device 10 after one or more recess etching processes were performed on the insulating layer 22 to reduce its thickness or height as shown in the figure. As such, a portion of the extended-height epi contact structure 26 is exposed for further processing. The amount of recessing of the layer of insulating material 22, and thus the amount of the extended-height epi contact structure 26 exposed above the surface of the recessed layer of insulating material 22, may vary depending upon the application.

Figure 1E:
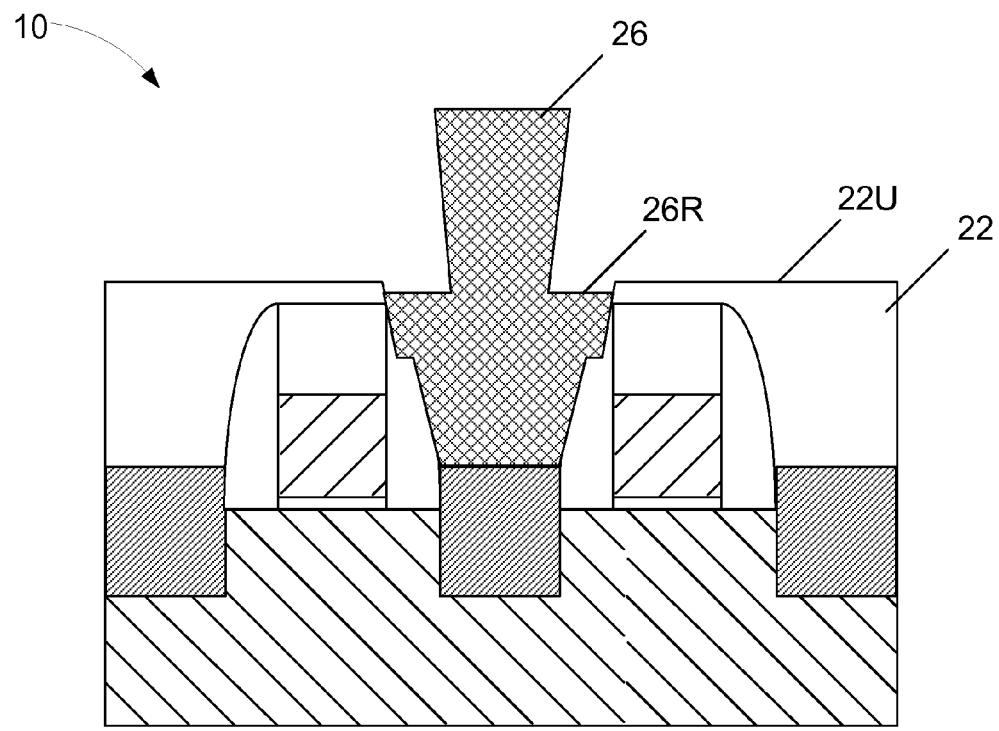

FIG. 1E illustrates the device 10 after one or more timed etching processes were performed to trim the exposed portion of the extended-height epi contact structure 26. As shown, the portion of extended-height epi contact structure 26 above the insulating layer 22 has been narrowed in lateral width and shortened in vertical height. Also, the base of the exposed portion of the extended-height epi contact structure 26 has been recessed such that its recessed surface 26R is below the upper surface 22U of the insulating material 22, as shown. The amount of trimming of the exposed portion of the extended-height epi contact structure 26 may vary depending upon the application.

Figure 1F:
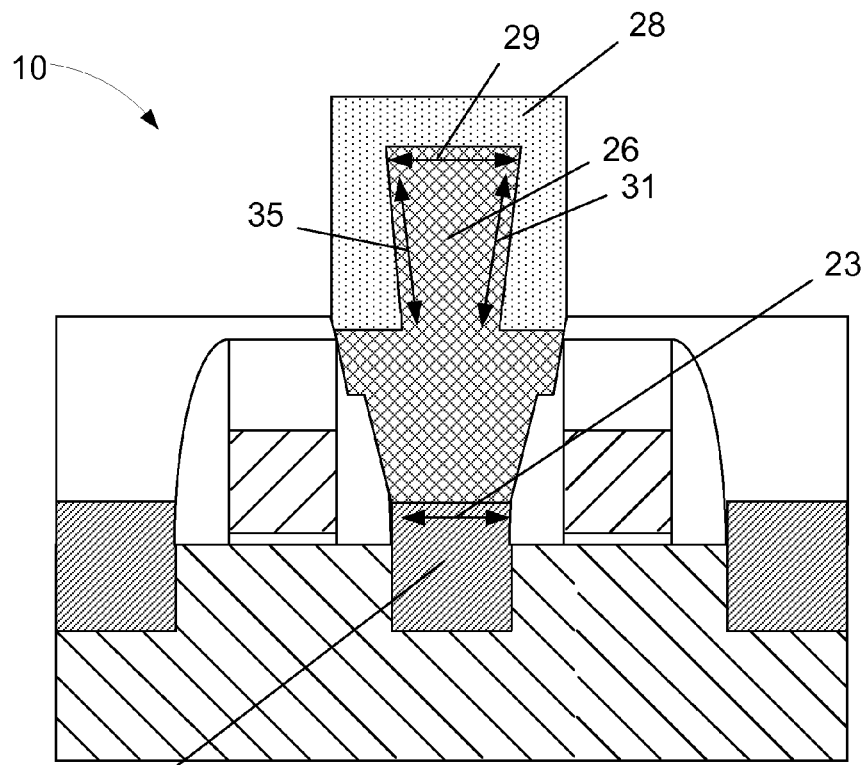

FIG. 1F illustrates the device 10 after a metal silicide region 28 was formed on the exposed and trimmed portion of the extended-height epi contact structure 26. The metal silicide region 28 depicted herein may be formed using a variety of different refractory metals, e.g., nickel, platinum, cobalt, etc., or combinations thereof, it may be formed to any desired thickness, and it may be formed using metal silicide formation techniques that are well known to those skilled in the art. The typical steps performed to form metal silicide regions are: (1) depositing a layer of refractory metal; (2) performing an initial heating process causing the refractory metal to react with underlying material; (3) performing an etching process to remove unreacted portions of the layer of refractory metal; and (4) performing an additional heating process to form the final phase of the metal silicide. In another embodiment, the metal silicide may also be formed by depositing a thin liner of metal, such as Ti or NiPt, depositing a TiN barrier on the liner and depositing a low-resistance conducting metal, such as W, on the barrier. The silicide is formed between the liner and conducting metal during the thermal process that occurs when the conducting metal is deposited. As such, no additional strip process is needed. In the illustrative example depicted herein, the metal silicide region 28 may be formed by initially performing a highly-conformal atomic layer deposition (ALD) process or an RF physical vapor deposition (PVD) process to deposit a layer of, for example, nickel, having a thickness of, for example, 1-5 nm. Thereafter, the anneal-etch-anneal process sequence described above is performed to complete the formation of the metal silicide region 28.

For the novel contact structure depicted herein, the contact length is the sum of the substantially vertical heights (along the side portions) 35, 31 and lateral width (along the upper surface) 29 of the previously exposed portions of the extended-height epi contact structure 26. This contact length is greater than the lateral width 23 of the source/drain region 20, and as such, the contact area is greater than that of prior art contact structures. Increasing the contact area leads to a desirable decrease in contact resistance that improves the performance of the device 10.

Figure 1G:
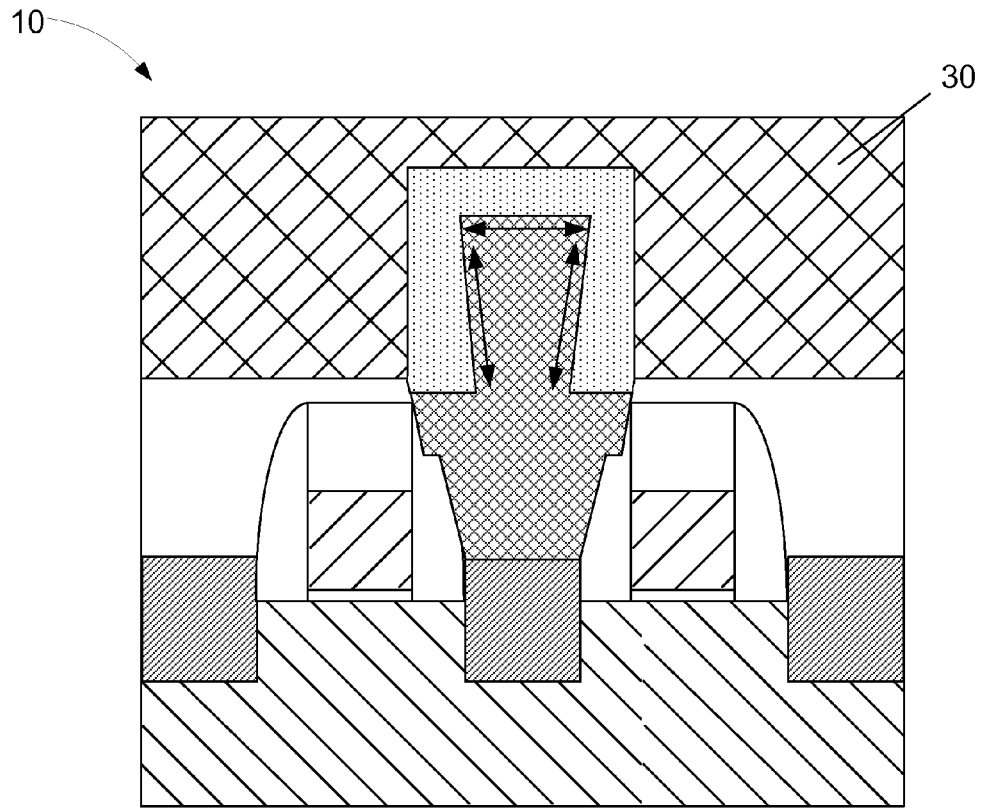

FIG. 1G illustrates the device 10 after one or more deposition processes were performed so as to deposit a conductive layer 30 on the device 10. In at least one embodiment, the conductive layer 30 includes tungsten.

Figure 1H:
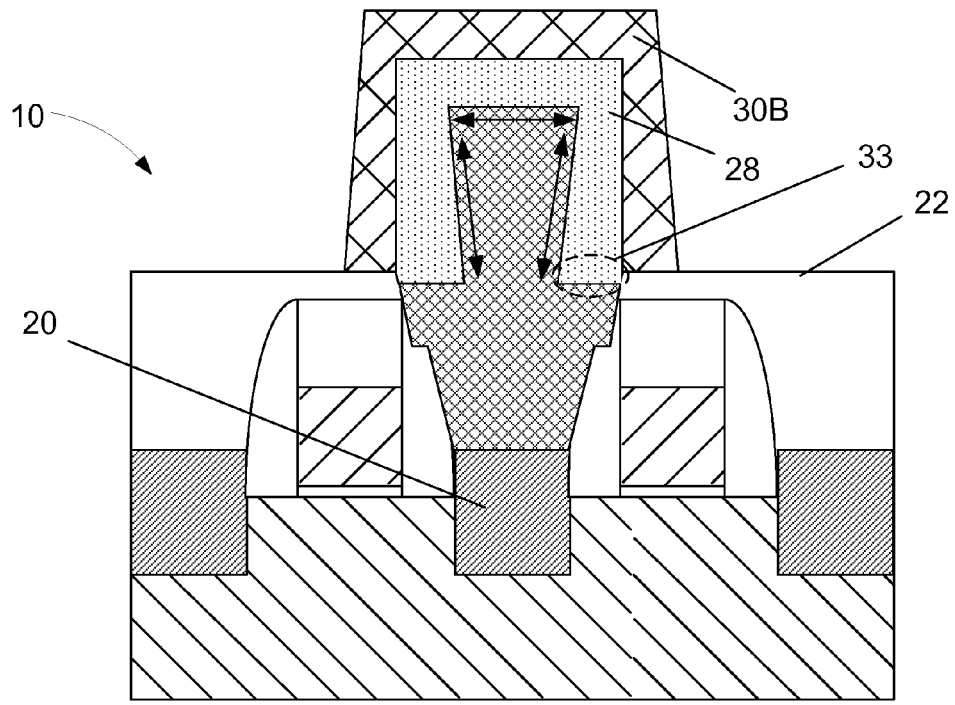

FIG. 1H illustrates the device 10 after the conductive layer 30 was patterned using known photolithography techniques so as to form a contact 30B on the metal silicide region 28. The shape of the contact 30B may vary depending upon the application and patterning technique used in various embodiments. The contact 30B is conductively coupled to the source/drain region 20 of the device 10. As shown, small portions 33 of the metal silicide region 28 are horizontally adjacent to the layer of insulating material 22 and not covered by the contact 30B.

Figure 1I:
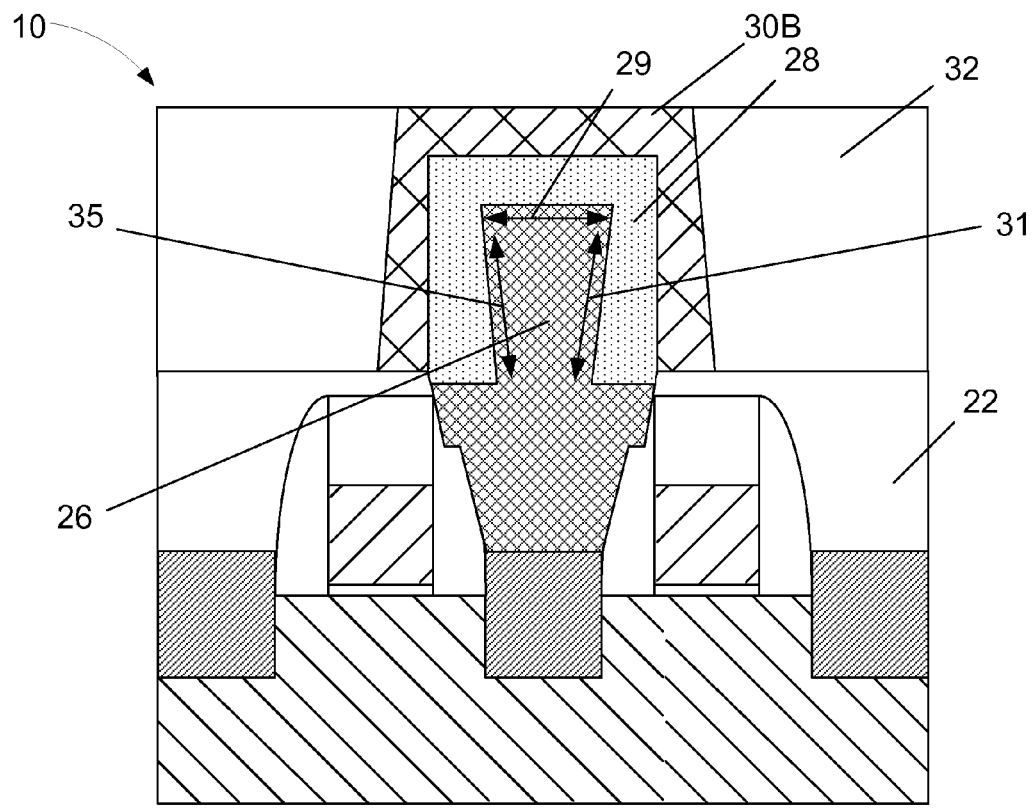

FIG. 1I illustrates the device 10 after another layer of insulating material 32 was deposited on the device 10, including on the contact 30B and the layer of insulating material 22. The layer of insulating material 32 may be comprised of the same or a different insulating material as that used for the layer of insulating material 22. One or more CMP processes were performed to remove any excess insulating material above the contact 30B.

Figure 2A:
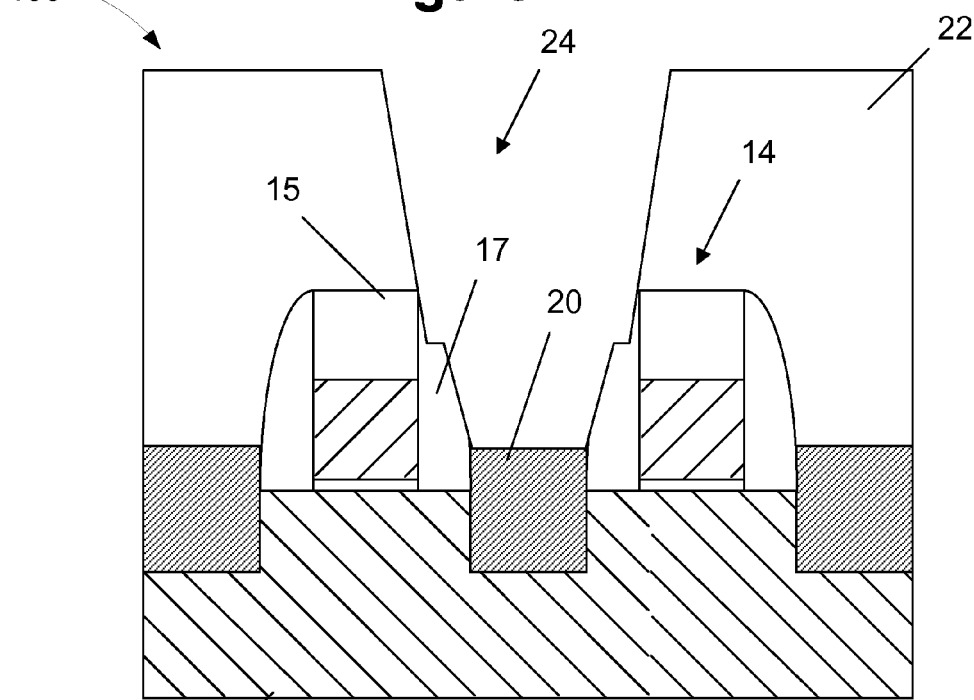
FIGS. 2A-2H also depict other methods disclosed herein of forming contact structures for semiconductor devices and the resulting devices.

FIGS. 2A-2H depict another illustrative method of forming contacts for semiconductor devices and the resulting devices, wherein like reference numbers will be used to indicate previously described structures. FIG. 2A depicts a device 100 at a point of fabrication that corresponds to that shown in FIG. 1B, i.e., after the formation of the source/drain regions 20, the layer of insulating material 22, the above-described gate structure 14, and the above-described contact opening 24 in the layer of insulating material 22. Also depicted are the above-described gate cap layer 15 and sidewall spacer material 17.

Figure 2B:
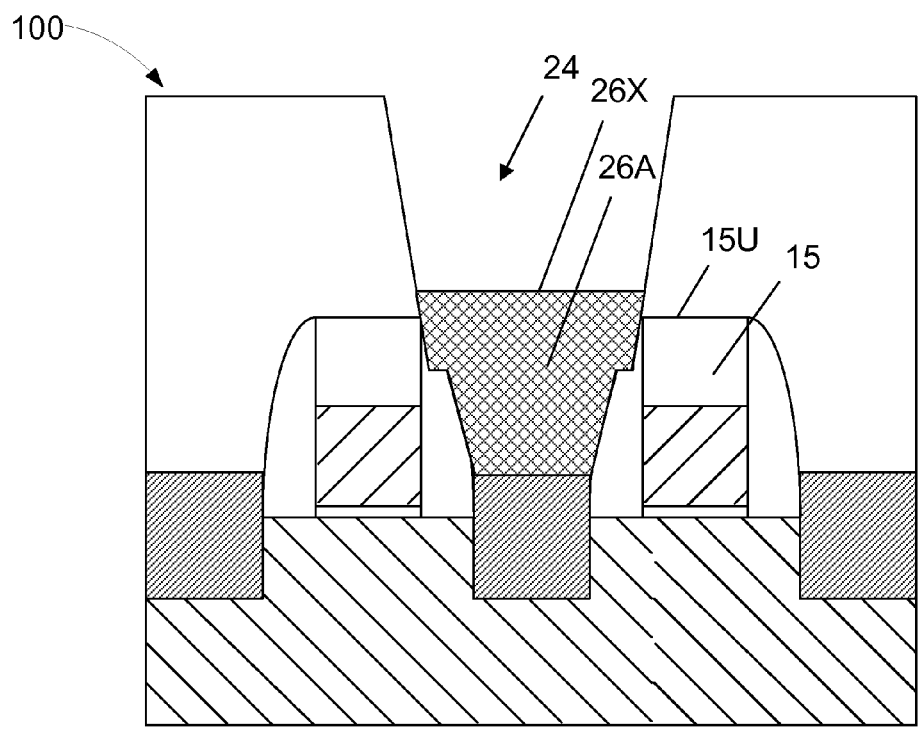

FIG. 2B illustrates the device 100 after one or more growth processes were performed to form a first portion of another embodiment of an extended-height epi contact structure 26A. Specifically, one or more epi growth processes were performed to grow a layer of epi semiconductor material on the source/drain region 20 of the device 100 to form the first portion of the extended-height epi contact structure 26A (first portion) within the contact opening 24. As shown, the first portion 26A is formed such that its upper surface 26X is positioned above the upper surface 15U of the gate cap layer 15. As before, the difference in height level between the upper surface 15U of the gate cap layer 15 and the upper surface 26X of the first portion 26A may vary depending upon the particular application. In one embodiment, the height difference may be about 30-70 nm. Relative to the extended-height epi contact structure 26 discussed previously, the first portion 26A shown in FIG. 2B is shorter.

Figure 2C:
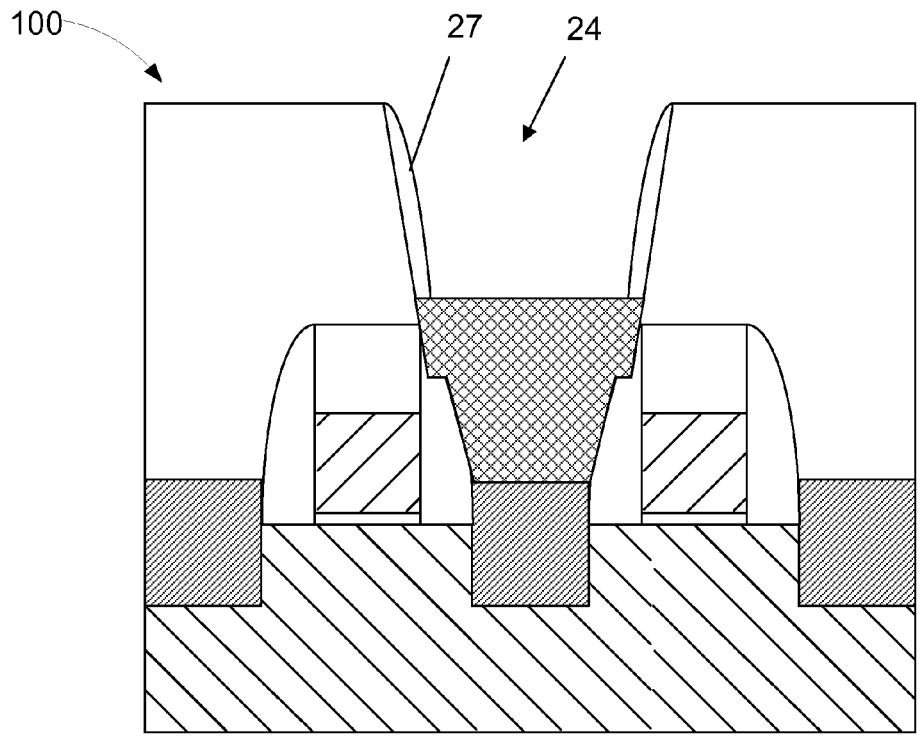

FIG. 2C illustrates the device 10 after a sidewall spacer 27 was formed in the contact opening 24 above the first portion 26A. The spacer 27 may be formed by depositing a layer of spacer material, such as silicon nitride, and thereafter performing an anisotropic etching process to define the spacer 27.

Figure 2D:
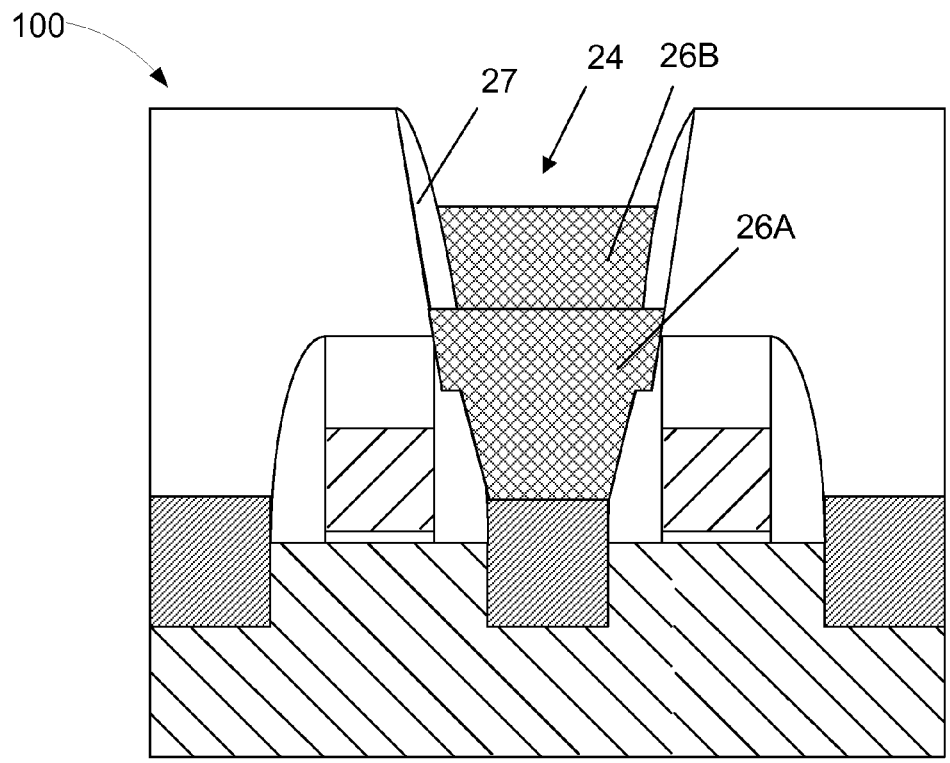

FIG. 2D illustrates the device 100 after a second portion of the extended-height epi contact structure 26B (second portion) was grown on the first portion 26A adjacent to, and in between, the spacer 27. In at least one embodiment, the portions 26A, 26B may be made of the same epi semiconductor material. In another embodiment, the portions 26A, 26B may be made of different epi semiconductor materials.

Figure 2E:
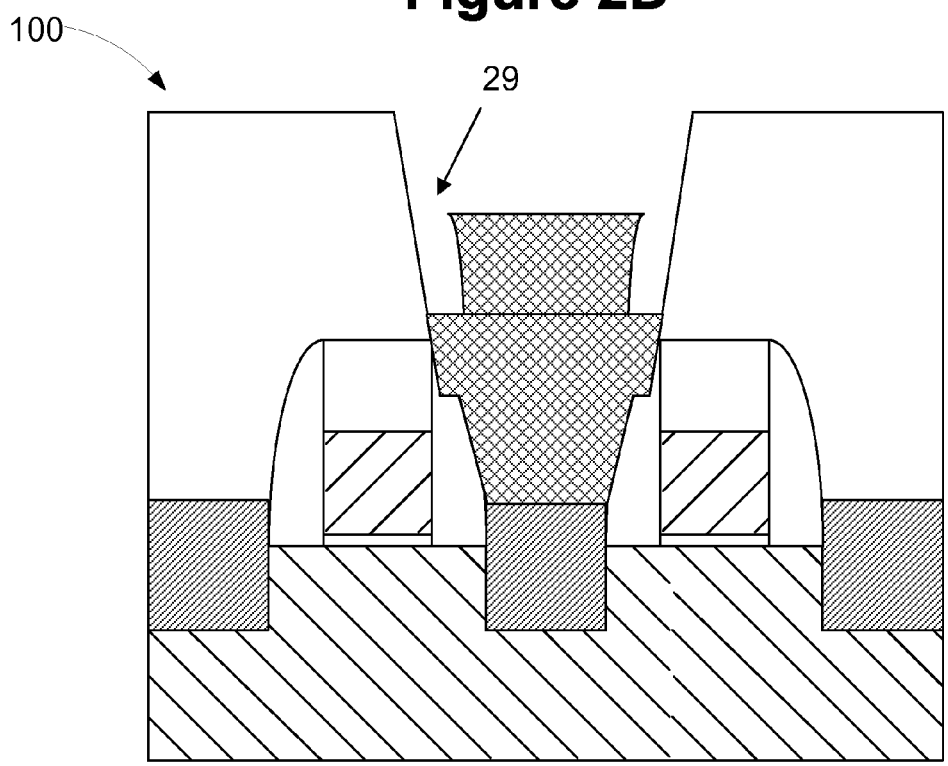

FIG. 2E illustrates the device 100 after one or more etching processes were performed to remove the spacer 27 selectively relative to the surrounding materials. This process operation results in the formation of trenches or spacer cavities 29.

Figure 2F:
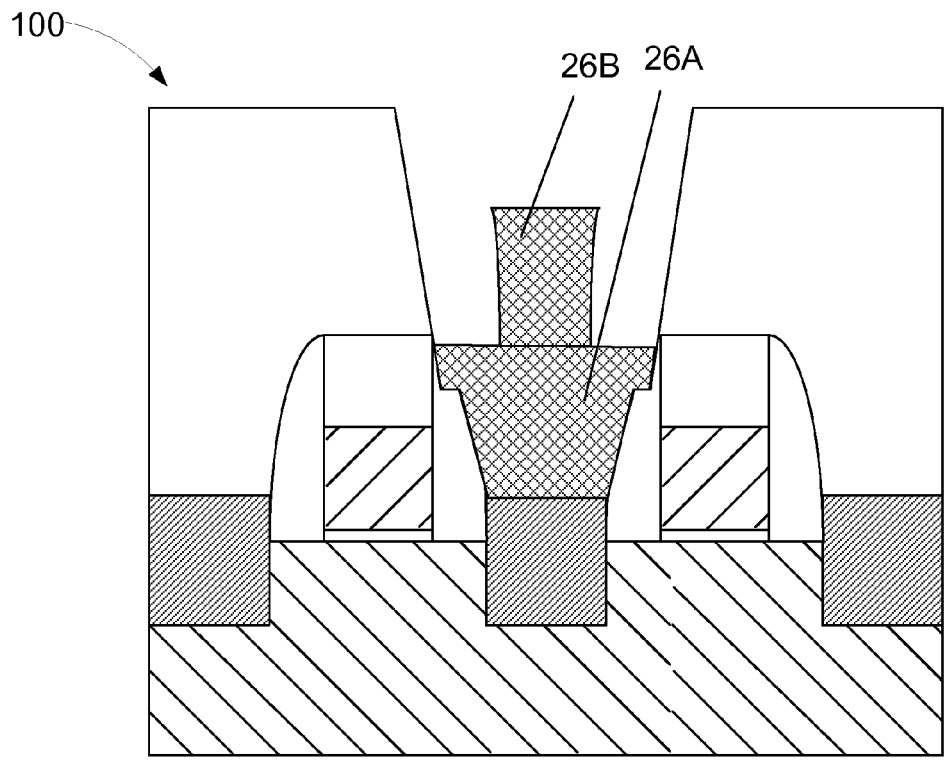

FIG. 2F illustrates the device 100 after one or more timed etching processes were performed to trim the exposed portions of the second portion 26B and to recess the exposed portions of the first portion 26A. As such, the second portion 26B has been narrowed in lateral width and shortened in vertical height. The amount of trimming of the second portion 26B and recessing of the first portion 26A may vary depending upon the application.

Figure 2G:
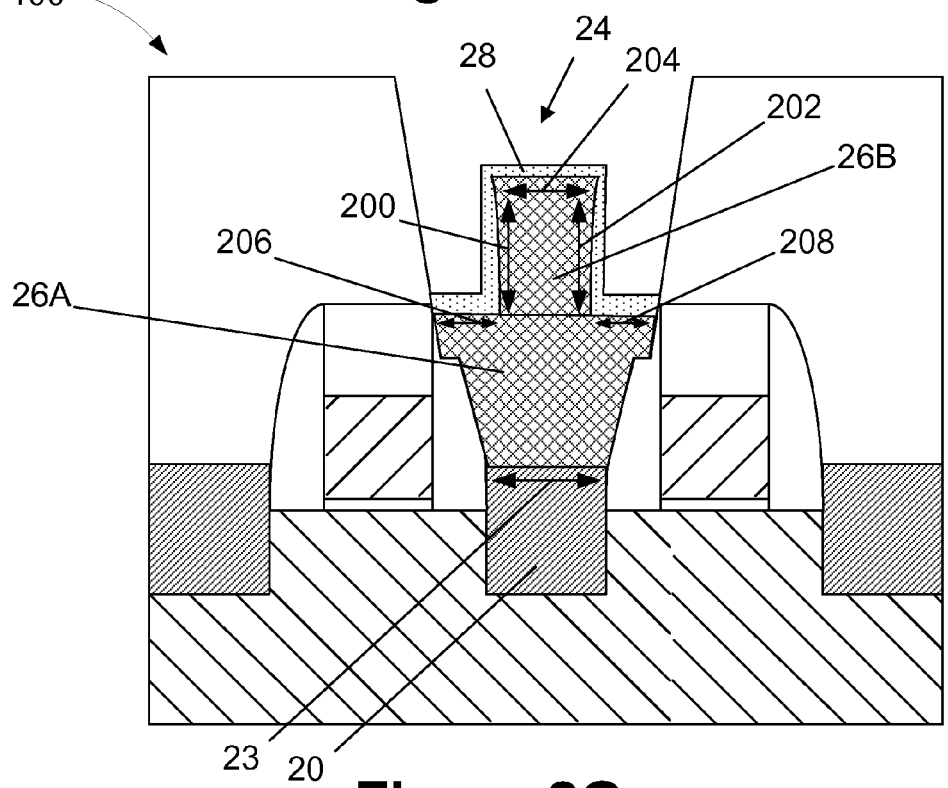

FIG. 2G illustrates the device 100 after a metal silicide region 28 was formed on the first and second portions 26A, 26B within the contact opening 24. The metal silicide region 28 may be formed of any metal silicide and may be formed to any desired thickness as described previously. The contact length of the overall contact structure is the sum of the substantially vertical heights 200, 202 and lateral width 204 of the second portion 26B, as well as the lateral widths 206, 208 of the first portion 26A. This contact length is greater than the lateral width 23 of the source/drain region 20, and, as such, the contact area is greater than that of prior art contact structures. Increasing the contact area leads to a desirable decrease in contact resistance that improves the performance of the device 100.

Figure 2H:
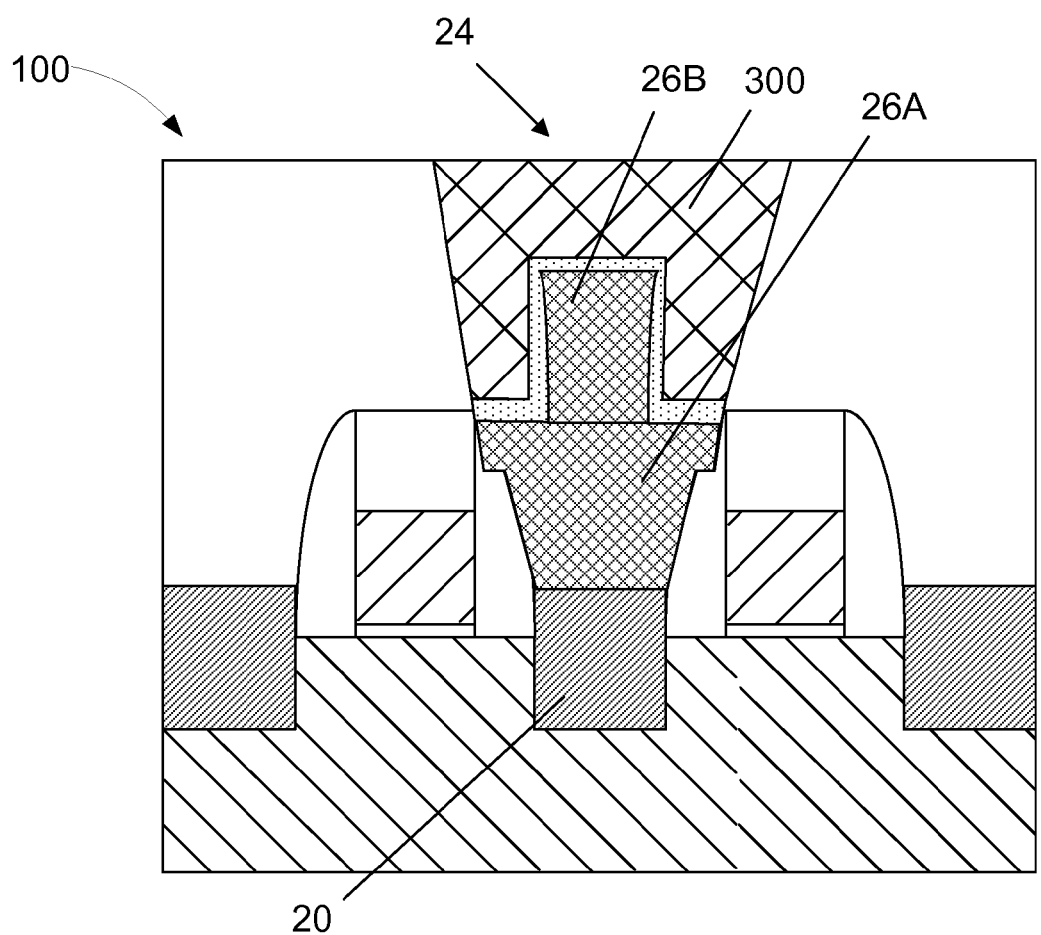

FIG. 2H illustrates the device 100 after one or more deposition processes and CMP processes were performed to form a conductive contact 300 in the contact opening 24. In at least one embodiment, the conductive contact 300 includes tungsten. The contact 300 is conductively coupled to the source/drain region 20 through the first and second portions of the extended-height epi contact structure 26B, 26A.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a contact structure to a source/drain region of a transistor device, said transistor device comprising a gate structure and a gate cap layer positioned above said gate structure, the method comprising:
    forming an extended-height epi contact structure that is conductively coupled to said source/drain region, said extended-height epi contact structure comprising an upper surface that is positioned at a height level that is above a height level of an upper surface of said gate cap layer;
    performing at least one etching process to trim at least a lateral width of a portion of said extended-height epi contact structure, wherein a height level of an upper surface of said trimmed extended-height epi contact structure is above said height level of said gate cap layer;
    after performing said at least one etching process, forming a metal silicide material on at least a portion of said trimmed extended-height epi contact structure; and
    forming a conductive contact on said metal silicide material.

2. The method of claim 1, further comprising:
    forming a contact opening in a layer of insulating material that exposes said source/drain region; and
    forming said extended-height epi contact structure in said contact opening.

3. The method of claim 2, wherein a portion of said metal silicide material is horizontally adjacent to said layer of insulating material.

4. The method of claim 1, wherein performing said at least one etching process comprises recessing a layer of insulating material adjacent to said extended-height epi contact structure, thus exposing a portion of said extended-height epi contact structure.

5. The method of claim 1, wherein forming said extended-height epi contact structure comprises:
    forming a first portion of said extended-height epi contact structure on said source/drain region;
    forming a spacer above said first portion of said extended-height epi contact structure; and
    forming a second portion of said extended-height epi contact structure adjacent to said spacer on said first portion.

6. The method of claim 5, further comprising removing said spacer, thereby defining a spacer cavity, wherein forming said metal silicide material comprises forming said metal silicide material in said spacer cavity.

7. The method of claim 1, wherein said source/drain region is a raised source/drain region having a first lateral width, wherein said upper surface of said trimmed extended-height epi contact structure has a second lateral width, and wherein said trimmed extended-height epi contact structure comprises first and second sidewall portions having respective first and second vertical heights, a combined length of said second lateral width and said first and second vertical heights defining a contact length of said trimmed extended-height epi contact structure that is greater than said first lateral width.

8. The method of claim 1, wherein said source/drain region is a raised source/drain region having a first lateral width, wherein said upper surface of said trimmed extended-height epi contact structure has a second lateral width, and wherein said trimmed extended-height epi contact structure comprises first and second sidewall portions and first and second substantially horizontal surface portions positioned at a height level that is below said height level of said upper surface of said trimmed extended-height epi contact structure, said first and second sidewall portions having respective first and second vertical heights and said first and second substantially horizontal surface portions having respective third and fourth lateral widths, wherein a combined length of said second, third, and fourth lateral widths and said first and second vertical heights define a contact length of said trimmed extended-height epi contact structure that is greater than said first lateral width.

9. The method of claim 8, wherein said height level of said first and second substantially horizontal surface portions is positioned below said height level of said gate cap layer.

10. A method, comprising:
    forming a first epi semiconductor material in a source/drain region of a semiconductor device, said first epi semiconductor material comprising a first lateral width at an upper surface thereof;
    forming an extended-height epi contact structure on said first epi semiconductor material, said extended-height epi contact structure comprising an upper surface and first and second side surfaces, all three of which collectively define a contact length of said extended-height epi contact structure that is greater than said first lateral width; and
    forming a metal silicide region on said upper surface and said first and second side surfaces of said extended-height epi contact structure.

11. The method of claim 10, further comprising:
    forming a contact opening in a layer of insulating material that exposes said source/drain region; and
    forming said extended-height epi contact structure in said contact opening.

12. The method of claim 11, wherein a portion of said metal silicide region is horizontally adjacent to said layer of insulating material.

13. The method of claim 10, wherein forming said extended-height epi contact structure comprises:
    recessing a layer of insulating material adjacent to said extended-height epi contact structure, thus exposing a portion of said extended-height epi contact structure; and
    trimming said exposed portion of said extended-height epi contact structure.

14. The method of claim 10, wherein forming said extended-height epi contact structure comprises:
    forming a first portion of said extended-height epi contact structure on said source/drain region;
    forming a spacer above said first portion of said extended-height epi contact structure; and forming a second portion of said extended-height epi contact structure adjacent to said spacer on said first portion.

15. The method of claim 14, further comprising removing said spacer, thereby defining a spacer cavity, wherein forming said metal silicide region comprises forming said metal silicide region in said spacer cavity.

16. The method of claim 10, wherein said extended-height epi contact structure and said first epi semiconductor material comprise substantially the same semiconductor material.

17. The method of claim 10, wherein a gate structure of said device comprises a high-k/metal gate configuration.

18. The method of claim 10, further comprising forming a conductive contact structure on said metal silicide region.

19. A method of forming a contact structure to a source/drain region of a transistor device, said transistor device comprising a gate structure and a gate cap layer positioned above said gate structure, the method comprising:
    forming an extended-height epi contact structure that is conductively coupled to said source/drain region, said extended-height epi contact structure comprising an upper surface that is positioned at a height level that is above a height level of an upper surface of said gate cap layer;
    performing at least one etching process to trim at least a lateral width of a portion of said extended-height epi contact structure, wherein performing said at least one etching process comprises recessing a layer of insulating material adjacent to said extended-height epi contact structure so as to expose a portion of said extended-height epi contact structure;
    after performing said at least one etching process, forming a metal silicide material on at least a portion of said trimmed extended-height epi contact structure; and
    forming a conductive contact on said metal silicide material.

20. The method of claim 19, wherein performing said at least one etching process comprises performing at least one first etching process to recess said layer of insulating material so as to expose said portion of said extended-height epi contact structure, and thereafter performing at least one second etching process to trim said at least said lateral width of said portion of said extended-height epi contact structure so as to form said trimmed extended-height epi contact structure.

* * * * *